United States Patent
Lin

(10) Patent No.: US 8,981,816 B2
(45) Date of Patent: Mar. 17, 2015

(54) MULTI-INPUT VOLTAGE-TO-FREQUENCY CONVERSION CIRCUIT

(71) Applicant: Kun Shan University, Tainan (TW)

(72) Inventor: Min-Chuan Lin, Tainan (TW)

(73) Assignee: Kun Shan University, Tainan (TW)

( * ) Notice: Subject to any disclaimer, the term of this patent is extended or adjusted under 35 U.S.C. 154(b) by 0 days.

(21) Appl. No.: 14/283,799

(22) Filed: May 21, 2014

(65) Prior Publication Data
US 2015/0048865 A1 Feb. 19, 2015

(30) Foreign Application Priority Data

Aug. 16, 2013 (TW) .............................. 102215515 U

(51) Int. Cl.
*H03C 3/00* (2006.01)
*H03B 5/12* (2006.01)

(52) U.S. Cl.
CPC ...... *H03B 5/1253* (2013.01); *H03B 2201/0275* (2013.01)
USPC .............................. 327/101; 331/34; 331/143

(58) Field of Classification Search
USPC ....................................... 327/101; 331/34, 143
See application file for complete search history.

(56) References Cited

U.S. PATENT DOCUMENTS

| | | | | |
|---|---|---|---|---|
| 5,917,346 | A * | 6/1999 | Gord | 327/101 |
| 8,692,584 | B2 * | 4/2014 | Nakamura et al. | 327/101 |
| 2008/0122546 | A1 * | 5/2008 | Shiramizu et al. | 331/34 |
| 2009/0167444 | A1 * | 7/2009 | McCorquodale et al. | 331/34 |
| 2010/0127739 | A1 * | 5/2010 | Ebuchi et al. | 327/148 |
| 2011/0156604 | A1 * | 6/2011 | Kuo et al. | 315/185 R |
| 2011/0215875 | A1 * | 9/2011 | Yagishita et al. | 331/34 |
| 2012/0169305 | A1 * | 7/2012 | Kwon et al. | 323/268 |
| 2012/0182080 | A1 * | 7/2012 | Sinitsky et al. | 331/143 |
| 2013/0222069 | A1 * | 8/2013 | Paidimarri et al. | 331/47 |
| 2014/0306775 | A1 * | 10/2014 | Choi et al. | 331/182 |

* cited by examiner

*Primary Examiner* — Ryan Jager
(74) *Attorney, Agent, or Firm* — Hamre, Schumann, Mueller & Larson, P.C.

(57) ABSTRACT

A multi-input voltage-to-frequency conversion circuit, includes: a multi-input operational amplifier amplifying one of multiple voltage signals in response to multiple control signals to generate an amplified voltage; a voltage-to-current converter converting the amplified voltage into a sensed current, and generating an oscillation current based on the sensed current and on an offset voltage that is associated with a predetermined frequency range corresponding to the one of the voltage signals; and a current-controlled oscillator generating, based on the oscillation current, a periodic pulse signal that has a frequency linearly proportional to the magnitude of the one of the voltage signals.

10 Claims, 3 Drawing Sheets

MULTI-INPUT VOLTAGE-TO-FREQUENCY CONVERSION CIRCUIT

CROSS-REFERENCE TO RELATED APPLICATION

This application claims priority to Taiwanese Application No. 102215515, filed on Aug. 16, 2013, the contents of which are hereby incorporated by reference.

BACKGROUND OF THE INVENTION

1. Field of the Invention

The invention relates to a voltage-to-frequency conversion circuit, and more particularly to a multi-input voltage-to-frequency conversion circuit.

2. Description of the Related Art

Referring to FIG. 1, a conventional voltage-to-frequency conversion circuit is shown to include an operational amplifier 11, a voltage-to-current converter 12 coupled to the operational amplifier 11, and a current-controlled oscillator 13 coupled to the voltage-to-current converter 12. The operational amplifier 11 receives an input voltage (Vin) at its inverting input end 111, and amplifies the input voltage (Vin) so as to output an amplified voltage (Vamp) at its output end. The voltage-to-current converter 12 receives the amplified voltage (Vamp) from the output end of the operational amplifier 11, and converts the amplified voltage (Vamp) into a sensed current (I1). The current-controlled oscillator 13 is operable to generate a periodic pulse signal based on the sensed current (I1), and outputs the periodic pulse signal at an output end 131 thereof. The periodic pulse signal has a frequency linearly proportional to the magnitude of the input voltage (Vin).

In such a configuration, only the inverting input end 111 of the operational amplifier 11 is used to receive the single input voltage (Vin) to be converted at each time. Therefore, if there are different input voltages to be converted, which correspond respectively to various biomedical signals associated with the same human or animal body and are provided respectively by different signal lines, the conventional voltage-to-frequency conversion circuit has to convert the different input voltages one by one. It is noted that, prior to each conversion, the inverting input end 111 of the operational amplifier 11 must be manually disconnected from a previous signal line, and then connected to another signal line for processing a desired input voltage. In this case, contact resistances each induced by electrical connection between the inverting input end 111 of the operational amplifier 11 and a corresponding signal line may differ from each other. In addition, it may not be ensured that periodic pulse signals obtained by the conventional voltage-to-frequency conversion circuit may correspond respectively to the different input voltages under the same physiological condition of the human or animal body. As a result, there may be an error in a biomedical signal-based integrated judgment made for the human or animal body based on the periodic pulse signals provided by such conventional voltage-to-frequency conversion circuit.

SUMMARY OF THE INVENTION

Therefore, an object of the present invention is to provide a multi-input voltage-to-frequency conversion circuit that can overcome the aforesaid drawbacks of the prior art.

According to the present invention, a multi-input voltage-to-frequency conversion circuit comprises a multi-input operational amplifier, a voltage-to-current converter and a current-controlled oscillator.

The multi-input operational amplifier has a plurality of control ends used to respectively receive a plurality of external control signals, a plurality of non-inverting input ends used to respectively receive a plurality of voltage signals, an inverting input end for receiving a negative feedback voltage, and an output end. The multi-input operational amplifier is operable to amplify one of the voltage signals in response to the control signals so as to output an amplified voltage at the output end. The negative feedback voltage is associated with the amplified voltage.

The voltage-to-current converter is coupled to the inverting input end and the output end of the multi-input operational amplifier for receiving the amplified voltage from the output end and for providing the negative feedback voltage to the inverting input end. The voltage-to-current converter is operable to convert the amplified voltage into a sensed current and to generate an oscillation current based on the sensed current and on an offset voltage that is associated with a predetermined frequency range corresponding to said one of the voltage signals.

The current-controlled oscillator is coupled to the voltage-to-current converter for receiving the oscillation current therefrom. The current-controlled oscillator is operable to generate, based on the oscillation current, a periodic pulse signal that has a frequency linearly proportional to the magnitude of said one of the voltage signals.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Before the present invention is described in greater detail, it should be noted herein that throughout this disclosure, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout this disclosure should be interpreted as being such when looking at those elements alone.

Figure 1:
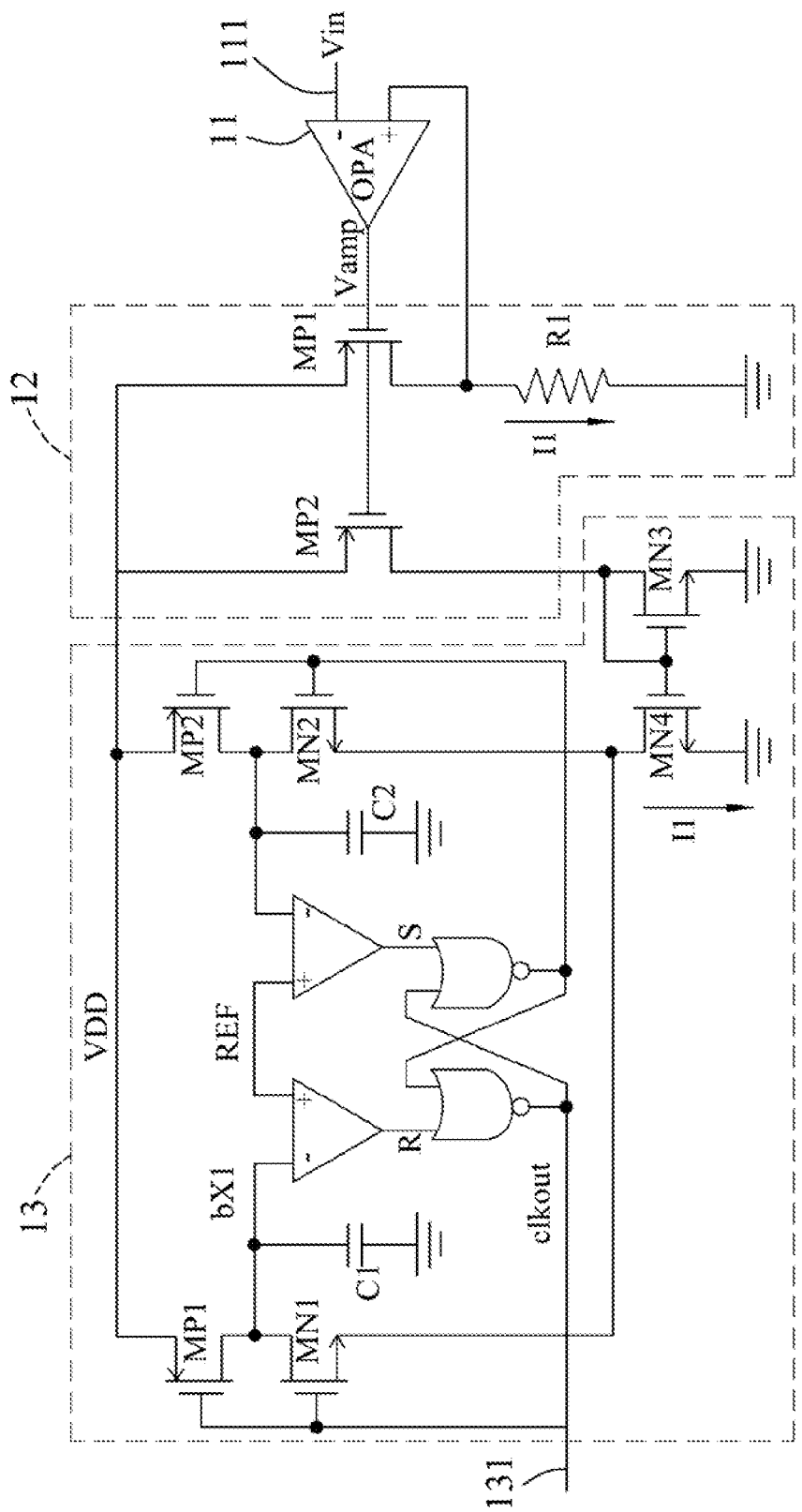
FIG. 1 is a schematic electrical circuit diagram illustrating a conventional voltage-to-frequency conversion circuit.
Figure 2:
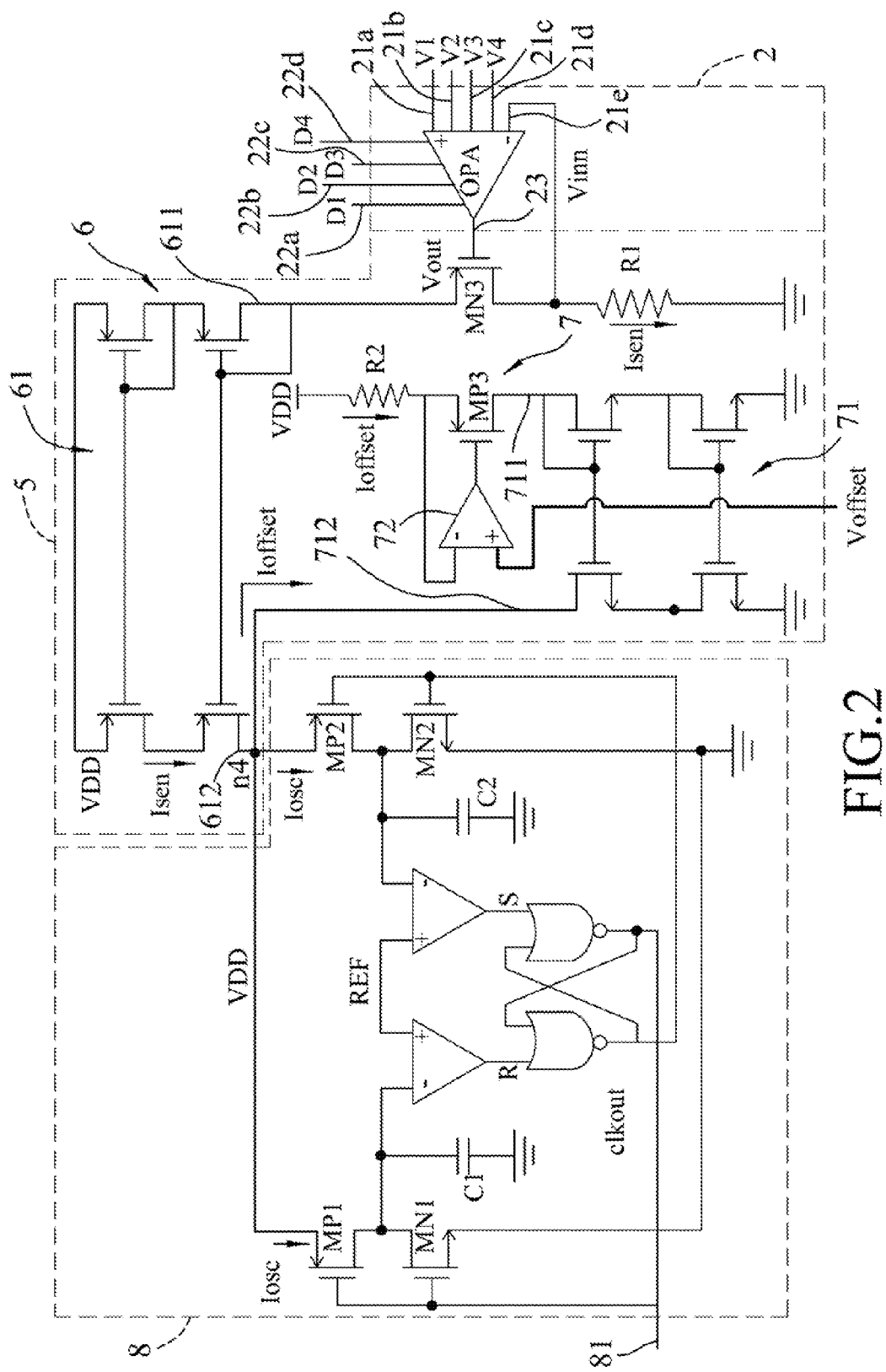
FIG. 2 is a schematic electrical circuit diagram illustrating the preferred embodiment of a multi-input voltage-to-frequency conversion circuit according to the present invention.

Referring to FIG. 2, the preferred embodiment of a multi-input voltage-to-frequency conversion circuit according to the present invention is shown to include a multi-input operational amplifier 2, a voltage-to-current converter 5 and a current-controlled oscillator 8.

The multi-input operational amplifier 2 has, but is not limited to, four non-inverting input ends ($21a$, $21b$, $21c$, $21d$), an inverting input end ($21e$), four control ends ($22a$, $22b$, $22c$, $22d$), and an output end 23. The control ends ($22a$, $22b$, $22c$, 22d) are used to respectively receive four external control signals (D1, D2, D3, D4). The non-inverting input ends (21a, 21b, 21c, 21d) are used to respectively receive four voltage signals (V1, V2, V3, V4). The inverting input end (21e) receives a negative feedback voltage (Vinn). The multi-input operational amplifier 2 is operable to amplify one of the voltage signals (V1~V4) in response to the control signals (D1~D4) so as to output an amplified voltage (Vout) at the output end 23. The negative feedback voltage (Vinn) is associated with the amplified voltage (Vout). In this embodiment, the voltage signals (V1~V4) may be generated respectively by different biomedical sensors chat are used to sense various physiological values, for example, temperature, pH value, urea and creatinine.

Figure 3:
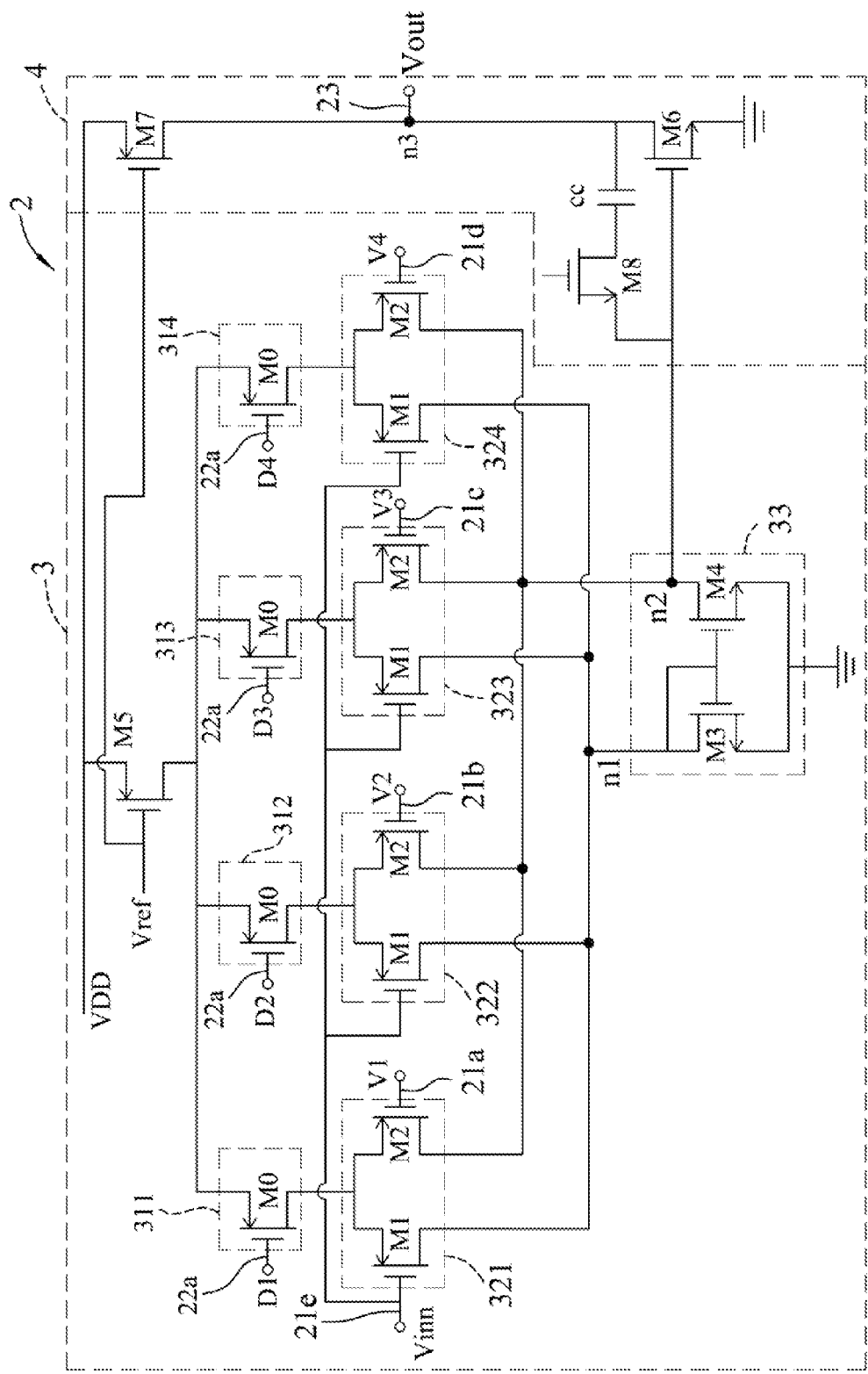
FIG. 3 is a schematic electrical circuit diagram illustrating a multi-input operational amplifier of the preferred embodiment.

Referring further to FIG. 3, in this embodiment, the multi-input operational amplifier 2 includes a first-stage amplifying circuit 3 and a second-stage amplifying circuit 4.

The first-stage amplifier 3 has the non-inverting input ends (21a~21d), the inverting input end (21e) and the control ends (22a~22d). and is operable to generate, based on the control signals (D1~D4) and the negative feedback voltage (Vinn), a first-stage amplified output associated with said one of the voltage signals (V1~V4). In this embodiment, the first-stage amplifying circuit 3 includes four bias current generators 311~314, four differential pairs 321~324, and a current mirror 33. Each of the bias current generators 311~314 includes a transistor (MO) that has a first terminal, a second terminal, and a control terminal serving as a respective one of the control ends (22a~22d), and generates a bias current in response to one of the control signals (D1~D4) received at the control terminal, i.e., the respective one of the control ends (22a~22d). For example, the transistor (MO) may be a P-type MCSFET with the source, drain and gate thereof serving respectively as the first, second and control terminals. Each of the differential pairs 321~324 is coupled among a respective one of the bias current generators 311~314, a first common node (n1) and a second common node (n2), receives the bias current from the respective, one of the bias current generators 311~314, and has a first input terminal that is coupled to the inverting input end (21e) for receiving the negative feedback voltage (Vinn), and a second input terminal that serves as a respective one of the non-inverting input ends (21a~21d). Each of the differential pairs 321~324 includes first and second transistors (M1, M2) (e.g., P-type MOSFETs), each of which has a first terminal, a second terminal and a control terminal, for example, source, drain and gate, respectively, For each of the differential pairs 321~324, the control terminals of the first and second transistors (M1, M2) serve respectively as the first and second input terminals, and the first terminals of the first and second transistors (M1, M2) axe coupled to the second terminal of the transistor (MO) of the respective one of the bias current generators 311~314. The second terminals of the first and second transistors (M1, M2) are coupled respectively to the first and second common nodes (n1, n2). The current mirror 33 includes third and fourth transistors (M3, M4) (e.g., N-type HOSFETs), each of which has a first terminal, a second terminal and a control terminal, for example, source, drain and gate, respectively. The first terminals of the third and fourth transistors (M3, M4) are coupled to ground that serves as a first reference node. The second terminals of the third and fourth transistors (M3, M4) arc coupled respectively to the first and second common nodes (n1, n2). The control terminals of the third and fourth transistors (M3, M4) are coupled to the second terminal of the third transistor (M3). The first-stage amplifying circuit 3 further includes a normally-conducting fifth transistor (M5), for example, a P-type MOSFET. The fifth transistor (M5) has a first terminal coupled to a second reference node, which is adapted to receive a reference voltage (VDD), a second terminal coupled to the first terminals of the transistors (MO) of the bias current generators 311~314, and a control terminal adapted to receive a bandgap reference voltage (Vref).

The second-stage amplifying circuit 4 has the output end 23, and is coupled to the first-stage amplifying circuit 3 for receiving the first-stage amplified output therefrom. The second-stage amplifying circuit 4 is operable to generate the amplified voltage (Vout) based on the first-stage amplified output, and outputs the amplified voltage (Vout) at the output end 23. In this embodiment, the second-stage amplifying circuit 4 includes a sixth transistor (M6), a normally-conducting seventh transistor (M7), en eighth transistor (M8) and a capacitor (cc). For example, the sixth and eighth transistors (M6, M8) are N-type MOSFETs, and the seventh transistor (M7) is a P-type MCSFET. Each of the sixth, seventh and eighth transistors has a first terminal, a second terminal and a control terminal, for example, source, drain and gate. The sixth and seventh transistors (M6, M7) are coupled in series between the first and second reference nodes, i.e., ground and VDD, wherein the first terminals of the sixth and seventh transistors (M6, M7) are coupled respectively to the first and second reference nodes. A third common node (n3) between the second terminals of the sixth and seventh transistors (M6, M7) is coupled to the output end 23 of the multi-input operational amplifier 2. The control terminal of the sixth transistor (M6) is coupled to the second common node (n2). The control terminal of the seventh transistor (M7) is used to receive the bandgap reference voltage (Vref). The capacitor (cc) and the eighth transistor (M8) are coupled in series between the second and third common nodes (n2, n3), wherein the capacitor (cc) is coupled to the third common node (n3), and the first terminal of the eighth transistor (M8) is coupled to the second common node (n2). The control terminal of the eighth transistor (M8) is floating.

In operation, for example, when the transistor (MO) of the bias current generator 311 conducts in response to the control signal (D1) while the transistors (MO) of the bias current generators 312~314 do not conduct in response to the control signals (D2~D4), the bias current generator 311 provides the bias current to the differential pair 321 while the bias current generators 312~314 are inactive. In this case, the first-stage amplified output associated with the voltage signal (V1) is generated through the current mirror 33. Then, the first-stage amplified output is further amplified through the sixth and seventh transistors (M6, M7) to generate the amplified voltage (Vout). It is noted that the eighth transistor (M8) and the capacitor (cc) function respectively as a phase compensation resistor and a phase compensation capacitor for circuit stabilization. In addition, due to the presence of the negative feedback voltage (Vinn), the amplified voltage (Vout) is stably outputted at the output end 23. Similarly, when the bias current generator 312 provides the bias current to the differential pair 322, the first-stage amplified output associated with the voltage signal (V2) is generated through the current mirror 33, and is then further amplified by the second-stage amplifying circuit 4 to generate the amplified voltage (Vout). When the bias current generator 313 provides the bias current to the differential pair 323, the first-stage amplified output associated with the voltage signal (V3) is generated through the current mirror 33, and is then further amplified by the second-stage amplifying circuit 4 to generate the amplified voltage (Vout). When the bias current generator 314 provides the bias current to the differential pair 324, the first-stage amplified output associated with the voltage signal (V4) is generated through the current mirror 33, and is then further amplified by the second-stage amplifying circuit 4 to generate the amplified voltage (Vout).

Referring again to FIG. 2, the voltage-to-current converter 5 is coupled to the inverting input end (21e) and the output end 23 of the multi-input operational amplifier 2 for receiving the amplified voltage (Vout) from the output end 23 and for providing the negative feedback voltage (Vinn) to the inverting input end (21e). The voltage-to-current converter 5 is operable to convert the amplified voltage (Vout) into a sensed current (Isen) and to generate an oscillation current (Iosc) based on the sensed current (Isen) and on an offset voltage (Voffset) that is associated with a predetermined frequency range corresponding to said one of the voltage signals (V1~V4). In this embodiment, the voltage-to-current converter 5 includes an output node (n4), a current mirror circuit 6 and a current compensation circuit 7.

The current mirror circuit 6 is coupled to the output node (n4), and the output end 23 and the inverting input end (21e) of the multi-input operational amplifier 2. The current mirror circuit 6 receives the amplified voltage (Vout) from the output end 23 of the multi-input operational amplifier 2, and is operable to sense the sensed current (Isen) based on the amplified voltage (Vout) so as to output the negative feedback voltage (Vinn), and to generate a first mirror current that corresponds to the sensed current (Isen) and that flows into the output node (n4). In this embodiment, the current mirror circuit 6 includes a first transistor (MN3), a first resistor (R1) and a first current mirror 61. The first transistor (MN3) has a first terminal coupled to the inverting input end (21e) of the multi-input operational amplifier 2, a second terminal, and a control terminal coupled to the output end 23 of the multi-input operational amplifier 2 for receiving the amplified voltage (Vout) therefrom. For example, the first transistor (MN3) is an N-type MOSFET, and the first and second terminals and the control terminal thereof are respectively source, drain and gate. The first resistor (R1) is coupled between the first terminal of the first transistor (MN3) and ground. The first current mirror 61 has an input end 611 coupled to the second terminal of the first transistor (MN3), and an output end 612 coupled to the output node (n4) In this embodiment, the first current mirror 62 consists of four P-type MOSFETs. The first current mirror 61 permits the sensed current (Isen) to flow out of the input end 611 thereof and through the first transistor (MN3) and the first resistor (R1), such that a voltage across the first resistor (R1) serves as the negative feedback voltage (Vinn), which corresponds to the amplified voltage (Vout). The first current mirror 61 further generates the first mirror current, that is substantially identical to the sensed current (Isen) and that flows out of the output end 612 thereof and into the output node in (n4).

The current compensation circuit 7 is coupled to the output node (n4). The current compensation circuit 7 is operable to generate an offset current (Ioffset) based on the offset voltage (Voffset) and to permit, a second mirror current that corresponds to the offset current (Ioffset) to flow from the output node (n4) into itself. Accordingly, the oscillation current (Iosc) is obtained by subtracting the second mirror current from the first mirror current, i.e., Iosc=Isen−Ioffset, and flows out of the output node (n4). In this embodiment, the current compensation circuit 7 includes a second resistor (R2), a second transistor (MP3), an operational amplifier 72 and a second current mirror 71. The second resistor (R2) has opposite terminals, one of which is used to receive the reference voltage (VDD). The second transistor (MP3) has a first terminal that is coupled to the other terminal of the second resistor (R2), a second terminal and a control terminal. For example, the second transistor (MP3) is a P-type MOSFET, and the first and second terminals and the control terminal are respectively source, drain and gate. The operational amplifier 72 has a non-inverting input end used to receive the offset voltage (Voffset), an inverting input end coupled to the first terminal of the second transistor (MP3), and an output, end coupled to the control terminal of the second transistor (MP3). The second current mirror 71 has an input end 711 coupled to the second terminal of the second transistor (MP3), and an output end 712 coupled to the output node (n4). In this embodiment, the second current mirror 71 consists of four N-type MOSFETs. The offset current (Ioffset) is generated based on the offset voltage (Voffset), and flows through the second resistor (R2) and the second transistor (MP3). The second current mirror 71 permits the offset current (Ioffset) to flow into the input end 711 thereof, and permits the second mirror current, which is identical to the offset current (Ioffset), to flow into the output end 712 thereof.

It is noted that, since the multi-input operational amplifier 2 may have different gains respectively in operations of the differential pairs 321~324 as a result of fabrication variation or/and mismatched devices of the differential pairs 322~324, the sensed current (Isen) may be affected. The current compensation circuit 7 is able to adjust the offset, current (Ioffset) through adjustment of the offset voltage (Voffset), thereby balancing the variance in the gains.

Referring again to FIG. 2, the current-controlled oscillator 8 is coupled to the voltage-to-current converter 5 for receiving the oscillation current (Iosc) therefrom. The current-controller oscillator 8 is operable to generate, based on the oscillation current (Iosc), a periodic pulse signal that has a frequency linearly proportional to the magnitude of said one of the voltage signals (V1~V4). In this embodiment, the current-controlled oscillator 8 includes two P-type MOSPETs (MP1, MP2), two N-type MOSFETs (MN1, MN2), two capacitors (C1, C2), two comparators, and a reset-set (RS) flip-flop. The capacitors (C1, C2) are alternately charged using the oscillation current (Iosc). Then, the periodic pulse signal it. thus generated by the RS flip-flop, and is outputted at a set input terminal 81 of the RS flip-flop. Since the feature of this invention does not reside in the configuration of the current-controlled oscillator 8, which is known to those skilled in the art, details of the same are omitted herein for the sake of brevity.

To sum up, the multi-input voltage-to-frequency conversion circuit of the present invention can simultaneously receive various input voltages as the voltage signals (V1~V4), and continuously convert the voltage signals (V1~V4) into respective periodic pulse signals through control via the control signals (D1~D4) within a short period of time, thereby resulting in convenience during use. In addition, for the voltage signals (V1~V4) being various biomedical signals associated with a human or animal body, the multi-input voltage-to-frequency conversion circuit of this invention can ensure that The respective periodic pulse signals are generated under the same physiological condition of the human or animal body. Therefore, such periodic pulse signals may be effectively integrated to correctly judge the biomedical stats of the human or animal body.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A multi-input voltage-to-frequency conversion circuit comprising:
   a multi-input operational amplifier having a plurality of control ends used to respectively receive a plurality of external control signals, a plurality of non-inverting input ends used to respectively receive a plurality of voltage signals, an inverting input end for receiving a negative feedback voltage, and an output end, said multi-input operational amplifier being operable to amplify one of the voltage signals in response to the control signals so as to output an amplified voltage at said output end, the negative feedback voltage being associated with the amplified voltage;
   a voltage-to-current converter coupled to said inverting input end and said output end of said multi-input operational amplifier for receiving the amplified voltage from said output end and for providing the negative feedback voltage to said inverting input end, said voltage-to-current converter being operable to convert the amplified voltage into a sensed current and to generate an oscillation current based on the sensed current; and on an offset voltage that is associated with a predetermined frequency range corresponding to said one of the voltage signals; and
   a current-controlled oscillator coupled to said voltage-to-current converter for receiving the oscillation current therefrom, said current-controlled oscillator being operable to generate, based on the oscillation current, a periodic pulse signal that has a frequency linearly proportional to the magnitude of said one of the voltage signals.

2. The multi-input voltage-to-frequency conversion circuit as claimed in claim 1, wherein said multi-input operational amplifier includes:
   a first-stage amplifying circuit having said control ends, said inverting input end and said non-inverting input ends, and being operable to generate, based on the control signals and the negative feedback voltage, a first-stage amplified output associated with said one of the voltage signals; and
   a second-stage amplifying circuit having said output end and being coupled to said first-stage amplifying circuit for receiving the first-stage amplified output therefrom, said second-stage amplifying circuit being operable to generate the amplified voltage based on the first-stage amplified output, and outputting the amplified voltage at said output end.

3. The multi-input voltage-to-frequency conversion circuit as claimed in claim 2, wherein said first-stage amplifying circuit includes:
   a plurality bias currant generators, each of which has a respective one of said control ends of said multi-input operational amplifier, and generates a bias current in response to one of the control signals received at the respective one of the said control ends;
   a plurality of differential pairs, each of which is coupled among a respective one of said bias current generators, a first common node, and a second common node that is coupled to said second-stage amplifying circuit, and receives the bias current from the respective one of said bias current generators, each of said differential pairs having a first input terminal that is coup to said inverting input end of said multi-input operational amplifier for receiving the negative feedback voltage, and a second input terminal that serves as a respective one of said non-inverting input ends of said multi-input operational amplifier; and
   a current mirror coupled among said first and second common nodes, and a first reference. node, said current mirror generating the first-stage amplified output and outputting the first-stage amplified output at said second common node.

4. The multi input voltage-to-frequency conversion circuit as claimed in claim 3, wherein:
   each of said bias current generators includes a transistor that has a first terminal, a second terminal, and a control terminal serving as the respective one of said control ends of said multi-input operational amplifier, said first terminals of Said transistors of said bias current orators being coupled with each other;
   each of said differential pairs includes
      a first transistor that has a control terminal serving as said first input terminal, a first terminal coupled to said second terminal of said transistor of the respective one of said bias generators, and a second terminal coupled to said first common node, and
      a second transistor that has a control terminal serving as said second input terminal, a first terminal coupled to terminal of said first transistor, and a second terminal coupled to said second common node and
   said current mirror includes third and fourth transistors, each of which has a first terminal coupled to said first reference node, a second terminal and a control terminal, said second terminals of said third and fourth transistors being coupled respectively to said first and second common nodes, said control terminals of Said third and fourth transistors being coupled to said second terminal of said third transistor.

5. The multi-input voltage-to-frequency conversion as claimed in claim 4, wherein said first-stage amplifying circuit further includes a normally-conducting fifth transistor coupled between a second reference node and said first terminal of said transistor of each of said bias current generators.

6. The multi-input voltage-to-frequency conversion circuit as claimed in claim 5, wherein said second-stage amplifying circuit includes:
   a series connection of a sixth transistor and a normally-conducting seventh transistor coupled between said first and second reference nodes, said sixth and seventh transistors being coupled respectively to said first and second reference nodes, a third common node between said sixth and seventh transistors being coupled to said output end of said multi-input operational amplifier, said sixth transistor having a control terminal that is coupled to said second common node; and
   a series connection of a capacitor and an eighth transistor coupled between said second and third common nodes.

7. The multi-input voltage-to-frequency conversion as claimed in claim 6, wherein:
   each of said transistors of said bias current generators, said first and second transistors of said differential pairs, end said fifth transistor and said seventh transistor of said second-stage amplifying circuit is a P-type MOSFET;
   each of said third and fourth transistors of said current mirror, and said sixth sad eighth transistors of said second-stag amplifying circuit is an N-type MOSFET;
   said first reference node is ground; and
   said second reference node is adapted to receive a reference voltage.

8. The multi-input voltage-to-frequency conversion circuit as claimed in claim 1, wherein said voltage-to-current converter includes:

an output node;

a current mirror circuit coupled to said output node, and said inverting input end and said output end of said multi-input operational amplifier, said current mirror circuit receiving the amplified voltage from said output end of said multi input operational amplifier, and being operable to sense the sensed current based on the amplified voltage so as to output the negative feedback voltage to said inverting input end of said multi-input operational amplifier, and to generate a first mirror current that corresponds to the sensed current and that flows into said output node; and a current compensation circuit coupled to said output node, said current compensation circuit being operable to generate an offset current based on the offset, voltage and to permit a second mirror current, that corresponds to the offset currant to flow from said output node into itself, such that the oscillation current is obtained lay subtracting the second mirror current from the first mirror current and flows out of said output node.

9. The multi-input voltage-to-frequency conversion circuit as claimed in claim 8, wherein:

said current mirror circuit includes a first, transistor having a first terminal coupled to said inverting input end of said multi-input operational amplifier, a second terminal, and a control terminal coupled to said output end of said multi-input operational amplifier for receiving the amplified voltage therefrom, a first resistor coupled between said first terminal of said first transistor and ground, and a first curse at mirror having an input end coupled to said second terminal of said first transistor, and an output end coupled to said output node, said first currant mirror permitting the sensed current to flow out of said input end thereof and through said first transistor and said first resistor, such that a voltage across said first resistor serves as the negative feedback voltage, said first current mirror generating the first mirror current that flows out of said output end thereof and into said output node; and said current compensation circuit includes a second resistor having opposite terminals, one of which is used to receive a reference voltage, a second transistor having a first terminal that is coupled, to the other one of said terminals of said second resistor, a second terminal, and a control terminal, an operational amplifier having a non-inverting input end that is used to receive the offset voltage, an inverting input end that is coupled to said first terminal of said second transistor, and an output end that is coupled control terminal of said second transistor, and a second current mirror having an input end that is coupled to said second terminal of said second transistor, and an output end that is coupled to said output node, said second current mirror permitting the offset current, which is associated with the offset voltage and flows through said second resistor and said second transistor, to flow into said input end thereof and permitting the second mirror current to flow into said output end thereof.

10. The multi-input voltage-to-frequency conversion circuit as claimed in claim 9, wherein:

said first current mirror includes four P-type MCSFETs, and said first transistor is an N-type MOSFET; and said second current mirror includes four N-type MOSFETs, and said second transistor is a P-type MOSFET.

* * * * *